(12) United States Patent
Chugg et al.

(10) Patent No.: US 8,335,949 B2
(45) Date of Patent: Dec. 18, 2012

(54) TUNABLE EARLY-STOPPING FOR DECODERS

(75) Inventors: Keith M. Chugg, La Canada, CA (US); Cenk Kose, La Jolla, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 139 days.

(21) Appl. No.: 12/614,292

(22) Filed: Nov. 6, 2009

(65) Prior Publication Data

US 2011/0113294 A1    May 12, 2011

(51) Int. Cl.
  *G06F 11/08* (2006.01)
  *G06F 11/30* (2006.01)
(52) U.S. Cl. ........................... 714/704; 714/780
(58) Field of Classification Search .............. None
  See application file for complete search history.

(56) References Cited

U.S. PATENT DOCUMENTS

| | | | |
|---|---|---|---|
| 7,058,878 B2* | 6/2006 | Kanaoka et al. | 714/794 |
| 7,500,167 B2* | 3/2009 | Widdup | 714/752 |
| 2002/0026615 A1* | 2/2002 | Hewitt et al. | 714/752 |
| 2003/0097623 A1* | 5/2003 | Razavilar et al. | 714/704 |
| 2004/0199848 A1* | 10/2004 | Tamesue et al. | 714/758 |
| 2007/0041475 A1* | 2/2007 | Koshy et al. | 375/340 |
| 2007/0079223 A1* | 4/2007 | Mondin et al. | 714/780 |
| 2007/0217541 A1* | 9/2007 | Liu et al. | 375/279 |

* cited by examiner

*Primary Examiner* — Ajay Bhatia
*Assistant Examiner* — Dipakkumar Gandhi
(74) *Attorney, Agent, or Firm* — Kilpatrick Townsend & Stockton LLP

(57) ABSTRACT

A method of decoding channel outputs using an iterative decoder to provide hard decisions on information bits includes activating each SISO decoder of the iterative decoder to provide soft-decisions associated with the information bits. The method also includes computing a fidelity estimate and stopping decoding based on the fidelity estimate.

21 Claims, 17 Drawing Sheets

TUNABLE EARLY-STOPPING FOR DECODERS

BACKGROUND OF THE INVENTION

The present disclosure relates generally to error correction techniques for data communications and more specifically to stopping rules for iterative decoders.

Error correction coding is a method whereby a sequence of digital information symbols (information bits if binary) are mapped onto another sequence of digital symbols (coded bits if binary) in such a way that redundancy is introduced. The coded symbols are modulated and transmitted across a communications channel that introduces uncertainty as to the actual value of the coded symbols. Error correction coding introduces redundancy that allows the receiver to determine the values of information symbols more reliably.

Error correction coding is often referred to as Error Control Coding (ECC), Forward Error Correction/Control (FEC), or simply coding. The field of coding is well established in both the research literature and engineering practice. Standard models for designing and evaluating coding schemes include three components: (i) the encoder, which maps the information symbols to the coded symbols; (ii) the channel, which introduces uncertainty; and (iii) the decoder, which attempts to determine the values of the information symbols that were transmitted. The channel is typically modeled statistically and this model typically includes the physical propagation channel and other components in the communication system. For example, the channel model can include the modulator and demodulator operations performed at the transmitter and receiver, respectively. FIG. 1 is a simplified diagram of a basic system model.

The most common case considered in the literature is that of a binary information sequence, binary coded symbols, and a memoryless channel. The two most common channel models are the Binary Symmetric Channel (BSC) and the Binary Antipodal Additive White Gaussian Noise (BI-AWGN) Channel.

As an example, an encoder may accept information bits in groups of size K and produce N coded bits, with N>K. The rate of this code is r=K/N and measures the rate of information bits per channel use on the binary channel. In FIG. 1 the information bit sequence is denoted by $b[i]$ (110), the coded bit sequence is denoted by $c[j]$ (120), and the output of the channel is denoted by $z[j]$ (130). The variable in brackets represents time index (e.g., $b[10]$ is the information bit at time index 10). Because the channel is modeled as memoryless, it is described statistically by the probability law for the channel output ($z[j]$) given the value of the channel input ($c[j]$) at the same time.

With the BSC model, the channel output $z[j]$ is binary and the channel is described by the probability that $z[j]$ is not equal to $c[j]$. Specifically, the model assumes that $P(z[j]=0|c[j]=1)=P(z[j]=1|c[j]=0)=p$. The decoder produces a decision on the value of each information bit, and the probability of error in this decision is less than p for cases when coding has utility. This gives rise to the term error correction since the BSC introduces errors and the code 'corrects' these errors.

In the BI-AWGN model, the channel output $z[j]$ is real-valued and the channel is described by the set of probability density functions (pdfs) of $z[j]$ conditioned on each value of $c[j]$. In the BI-AWGN model, the pdf of $z[j]$ is Gaussian with variance determined by the noise level and mean determined by the value of $c[j]$. Specifically, the mean is $+m$ if $c[j]=0$ and $-m$ if $c[j]=1$, where m is a constant dependent on the channel signal to noise ratio (SNR). Note that in this case it is less natural than that of the BSC to interpret the channel as introducing errors. However, if one were to determine $c[j]$ based only on the value of $z[j]$, ignoring all redundancy introduced in the coded bit sequence by the encoder, then a good rule is to determine that $c[j]$ is 0 if $z[j]>0$, otherwise $c[j]$ is 1. In fact, if the decoder only has access to the sign of $z[j]$, from the point of view of the decoder the channel is equivalent to a BSC. The larger the absolute value of $z[j]$, the less statistically likely that this implied decision is incorrect. Thus, in the BI-AWGN case, the sign of $z[j]$ contains information about the best memoryless decision on $c[j]$ (i.e., not exploiting the code structure), and $|z[j]|$ provides a level of confidence in this decision.

A channel output that contains both an implicit decision on the channel input (e.g., 0 or 1) and a measure of confidence on this decision is said to be a soft decision or to contain soft decision information. In contrast, a channel output without confidence information is said to be a hard decision. The BSC is an example of a channel with outputs that are hard decisions on the channel input whereas the BI-AWGN is an example of a channel with outputs that are soft decisions on the channel inputs. More generally, the notion of soft decision information extends to any digital variable (e.g., one may consider a soft decision on the information bits). A decoder that utilizes soft decision information from the channel outputs (i.e., decoder inputs) is referred to as a soft decision decoder or a soft-in decoder. Conversely, if the decoder accepts hard decisions as inputs, it is a hard decision decoder or a hard-in decoder. Used properly, soft decision information provides performance gains relative to hard decision decoding. In practice, the real-valued channel output $z[j]$ will be quantized to a finite number of values for digital implementation of the decoder. This is still a form of soft decision information.

While FEC has been utilized in practical communication systems for many years, the advent of Turbo codes in the 1990's provided a significant advance in the state of the art. Subsequent to the introduction of Turbo codes, many codes were introduced that shared many characteristics of Turbo codes. The resulting class of codes is known as modern codes, turbo-like codes, iteratively decodable codes, or codes on sparse graphs. The common characteristics of a modern coding system (i.e., a coding system employing modern codes) are: (i) modeling the code constraints as a group of local code constraints; and (ii) iterative decoding of these local codes.

FIG. 2 is a simplified diagram of an encoder in a Turbo coding system. The system includes two encoders that encode the information bits. One encoder accepts as inputs the information bits (200) in the order that they are input to the Turbo encoder. The information bits are reordered by a permutation or interleaver before being input (220) to the second encoder. Coded bits produced by the two encoders (210, 230) may be punctured to produce the coded bit sequence (240) that is transmitted across the channel.

FIG. 3 is a simplified diagram of an iterative decoder in a Turbo coding system. The iterative decoder accepts the channel outputs (300) as inputs. Typically, these inputs to the decoder contain soft-decision information. The iterative decoder routes the set of channel outputs (310) corresponding to channel inputs from encoder 1 to a decoder for code 1 and routes the set of channel outputs (320) corresponding to channel inputs from encoder 2 to a decoder for code 2.

The iterative decoder is based on soft-in/soft-out (SISO) information for each of the codes. A SISO decoder accepts soft decision information on all variables associated with the corresponding encoder. This is the so-called soft-in information. In the present example, the SISO for code 1 will accept soft decision information on all variables associated with encoder 1. After the SISO decoding process, new (updated) soft decision information is produced. This is the so-called soft-out information. In general, this is new soft decision information on all variables associated with the corresponding code. This process of accepting input soft-in information, executing a SISO decoder, and producing soft-out information is referred to as an activation of the SISO decoder.

The soft decisions processed and exchanged by an iterative decoder are commonly referred to as beliefs, messages and metrics owing to the fact that they may be stored in various formats and therefore interpreted differently.

For the turbo code example, iterative decoding comprises a sequence of activations of the two SISO decoders with an exchange of soft decision information. The sequence of activation is called the activation schedule of the iterative decoder. In general, the activation schedule is not unique and is part of the iterative decoder design.

An activation schedule for the iterative decoder for the turbo codes may be as follows. First, activate SISO decoder 1, interleave the resulting updated soft decisions (330) on the information bits to provide soft-in information (340) to SISO 2, activate SISO 2 producing updated soft decisions (350), and deinterleave these updated soft decisions to provide soft-in information (360) to SISO 1. This sequence defines one iteration, and the iterative decoder will repeat this sequence multiple times—i.e., the iterative decoder runs multiple iterations. The initial activation of SISO 1 may occur with no soft-in information on the inputs to encoder 1. The interleaving of soft-decision information is a reordering of the time indices of this information. The deinterleaving operation is similar but uses the inverse of the permutation defining the interleaver.

The confidence level of soft decisions on the information bits (i.e., the inputs to SISO 1) should increase with more iterations. After the final iteration has been run, these soft decisions provide the final hard decisions on the information bits. A stopping rule is required to determine the final iteration. The convergence of iterative decoders is not guaranteed, although in practice the decisions on the information bits are often observed to stabilize.

The stopping rule may affect the latency, complexity, power consumption, and performance of the iterative decoder. One simple stopping rule is to run experiments to determine the information bit error rate (BER) as a function of the number of iterations run. The results of this experiment can be used to determine a number of iterations to be used that yields a good balance of performance and complexity. FIG. 4 shows a typical plot of bit error rate as a function of bit energy to noise power ratio (Eb/No) based on number of iterations. It is common for the BER performance of the iterative decoder to stabilize with increasing iterations. For example, as shown in FIG. 4 there is very little improvement in BER performance beyond 4 iterations. Since the latency and computational complexity of decoding is proportional to the number of iterations, in practice one would choose the minimum number of iterations necessary to achieve desired performance benefits. This approach leads to a stopping rule that runs a fixed number of iterations. This is the default stopping rule in the research literature—i.e., most performance results are presented with the number of iterations and this number is fixed as described above. This will be referred to as the fixed-iterations rule.

The fixed-iterations rule does not take into account the information produced by the decoder during the decoding of a particular set of channel measurements. Instead, it uses the average behavior over many decoding runs. Alternatively, one could monitor the soft-information being produced by the decoder and stop when it appears to have stabilized. The resulting stopping rules are referred to as early stopping rules. As an example, considering the turbo code iterative decoder, once all soft-decisions on the information bits have stabilized (i.e., converged), one may stop the decoding and provide final hard decisions.

Typically, early stopping rules have a fixed maximum number of iterations and therefore reduce the average number of iterations performed but not the maximum number of iterations. When comparing an early stopping rule to a fixed-iterations rule, the early stopping rule should result in little or no BER performance degradation and have a reduced average number of iterations. A number of early stopping algorithms have been presented in the literature with results presented in terms of this trade off.

The average decoding latency and computational complexity of an iterative decoder is proportional to the average number of iterations run. This average is with respect to decoding blocks. For some blocks the iterative decoder will converge quickly and will be stopped early, while others will utilize the maximum number of iterations. This results in a decoding algorithm with variable complexity and latency. For non-real-time applications, such as computer simulation, these benefits in the average characteristics may be directly beneficial.

For real-time applications, however, taking advantage of these average improvements may not be possible. When the average number of iterations is reduced, the average computational complexity of the decoder is decreased and this will typically decrease the average power consumption of the decoder. It is more difficult to capitalize on a reduction of the average decoding latency. This is because the maximum number of iterations determines the maximum decoding latency. For example, a fixed-iterations decoder with 20 iterations will have the same maximum latency as a decoder with early stopping using a maximum of 20 iterations but yielding an average of 10 iterations. The maximum latency determines the throughput speed of the decoder that can be guaranteed.

To benefit from reduced average decoding latency in a real-time system, the decoder can be augmented with an iteration control unit (ICU). This unit will monitor the number of iterations required for each decoding block and vary the maximum allowable number of iterations. The goal of the iteration control unit is to average out the effects of the variable decoding latency with minimal impact on the BER performance. For example, consider an early stopping rule that provides an average of 10 iterations with a maximum of 20 iterations. If the decoder was stopped early (say at 5 iterations) for many of the previous blocks, the ICU would set the maximum number of iterations at 20 for the current block. However, if many of the previous blocks required 20 iterations to decode, then the ICU would decrease the maximum number of iterations for the current block (say to 12 iterations).

The ICU controls the maximum number of iterations for the current block so that a given average latency, and hence average throughput, is maintained. Thus, the ICU maintains a latency budget and reduces the maximum number of iterations for the current block when it is behind schedule and increases the maximum number of iterations when it is ahead of schedule. One practical consequence of this approach is that the decoder will have to buffer incoming blocks of channel outputs since these typically arrive at a fixed speed. For example, a decoder designed to operate at an average speed dictated by 10 iterations will need to process some blocks for 20 iterations and will need to buffer incoming channel outputs during this time. More generally, the buffer fills up when the decoder is running behind schedule. Thus, the control algorithm used is a function of how large the buffer is for storing incoming blocks of channel measurements. Since this is a large amount of memory in typical implementations, it is desirable to buffer as few blocks as possible. Fortunately, the advantages of using an ICU can be obtained when buffering only a small number of additional channel measurements.

Augmenting an iterative decoder using early stopping with an ICU results in what we refer to as an early stopping system. FIG. 5 is a simplified illustration of an early stopping system in which measurements (500) from the channel are written to a buffer which may hold several received codeword blocks. Channel measurements are then converted to channel metrics (510), which are input to the decoder in accordance with known techniques. The ICU, configured with a prescribed target average number of decoder iterations, $t_{AVG}$ (530), and a maximum number of decoder iterations, $t_{MAX}$ (540), monitors the buffer status (520) and sets the maximum iteration count, $T_{MAX}$, (550), for the present block to be decoded. New channel measurements may be available when the decoder finishes and outputs decoded bits (560).

Relative to a decoder using a fixed number of iterations, an early stopping system may increase guaranteed throughput at the expense of increased storage and increased maximum decoding latency. The maximum decoding latency increases because some blocks will wait in the buffer before being processed. Thus, an early stopping system allows one to translate average throughput improvements of an early stopping decoder within the practical constraints of a finite maximum latency and finite storage resources.

An early stopping system allows for two modes of decoder operation: (i) fixed-iterations operation; and (ii) early stopping operation. In fixed-iteration operation, the latency for each decoding block is fixed. In early stopping operation, the latency for each decoding block is variable, but the maximum latency experienced by any block is fixed. If both decoding methods use the same maximum number of iterations, the early stopping operation will result in larger maximum latency. As an example, a fixed-iteration decoder may operate with 20 iterations at a throughput of 100 Megabits per second (Mbps) and a fixed latency of 1 millisecond (msec) per decoding block. An early stopping system operating with an average of 10 iterations may provide a throughput of 200 Mbps and maximum latency of 4 msec for any decoding block.

Iterative decoders using conventional early stopping can realize an improvement in error rate performance relative to an iterative decoder running a number of iterations equal to the average number of iterations for the conventional early stopping algorithm. However, if a higher throughput is desired (i.e., a lower number of average iterations), conventional early stopping cannot be used. In this case, the designer would use a fixed number of iterations corresponding to the desired throughput at the expense of a significant degradation in error rate performance.

Thus, it is desirable to have an early stopping system that allows for greater granularity in the trade-off between decoder throughput and maximum latency. Continuing the above example, suppose that it is desired to achieve a throughput of 400 Mbps, and a maximum decoding latency of more than 10 msec is acceptable. This requires an increase in throughput by a factor of 4 relative to the fixed iteration decoder. One option is to use a fixed-iteration decoder and set the maximum number of iterations to 5 (i.e., 20/4). This approach, however, will result in significant degradation in BER performance if the decoder does not approach convergence in 5 iterations. A standard early stopping rule will also not achieve the desired result. This is because early stopping rules are designed to minimize the average number of iterations required to achieve performance near that of a decoder than runs to convergence. Thus, techniques that overcome these and other shortcomings of conventional methods are desired.

SUMMARY OF THE INVENTION

Embodiments of the disclosure provide a finer trade-off between throughput, maximum latency, and BER performance compared to conventional methods. Some embodiments provide tunable early stopping rules for forward error correction decoders that compute soft decisions on the decoded bits. Other embodiments include techniques for iteration control, which can alter the parameters of the tunable early-stopping system to achieve a desired average number of iterations.

According to an embodiment of the present invention, a method of decoding channel outputs using an iterative decoder to provide hard decisions on information bits is provided. The method includes activating each SISO decoder of the iterative decoder to provide soft-decisions associated with the information bits. The method also includes computing a fidelity estimate and stopping decoding based on the fidelity estimate.

According to another embodiment of the present invention, a method of decoding a channel output using an iterative decoder is provided. The method includes activating each decoder of the iterative decoder to provide a first soft-decision, and computing a first estimated instantaneous bit error rate based on the first soft-decision. The method also includes repeating activating each decoder and computing an instantaneous estimated bit error rate to provide a plurality of soft-decisions and to compute a plurality of estimated instantaneous bit error rates, and stopping decoding of the channel output if an estimated instantaneous bit error rate of the plurality of estimated instantaneous bit error rates is less than a threshold value.

According to yet another embodiment of the present invention, a tunable early stopping decoder is provided. The tunable early stopping decoder includes a buffer configured to store channel outputs, an iterative decoder coupled to the buffer and configured to determine soft-decisions associated with information bits, and a tunable early stopping module coupled to the iterative decoder and configured to compute a fidelity estimate based on the soft-decisions.

Other features and capabilities of the disclosed embodiments will be apparent in view of the following detailed description and figures.

DETAILED DESCRIPTION OF THE INVENTION

Embodiments of the present invention provide systems and methods for tuning early stopping rules to allow performance trades in iterative decoders using modern error correcting codes (e.g., turbo-like codes) as measured by throughput, latency, error rate performance, and memory requirements. Some embodiments use a tunable early stopping algorithm to stop an iterative decoder when a suitable error performance has been achieved. This may be before convergence has occurred. A tunable early stopping algorithm can monitor the performance of an iterative decoder by computing a fidelity estimate. A fidelity estimate is an estimate of the error performance of the decoder or a quantity that is correlated with error rate performance. By stopping an iterative decoder based on the fidelity estimate, a tunable early stopping algorithm can allow the iterative decoder to operate in regimes prior to convergence. This can provide a mechanism for trade off between decoded performance and number of iterations that is not possible with conventional early stopping or fixed iteration methods.

In an embodiment a tunable early stopping module implements a tunable early stopping rule. A tunable early stopping rule may include a set of tuning parameters. Altering one or more of the tuning parameters of a tunable early stopping rule may change the probability of codeword error and the average number of iterations run per code block. Similarly, this trade may be viewed in terms of the probability of information bit error and average number of iterations.

Some embodiments of the present invention may include modifying conventional early stopping algorithms to obtain tunable early stopping algorithms. For example, a hard-decision assisted (HDA) early stopping algorithm stops the decoder when the decisions for all of the information bits do not change over some number of consecutive iterations. In an embodiment, the HDA early stopping algorithm may be modified to provide a tunable early stopping algorithm in which the decoder is stopped when some fraction of the bit decisions remain unchanged for consecutive iterations. The fraction of bit decisions that remain unchanged provides a fidelity estimate. Another conventional early stopping algorithm is the valid codeword (VCW) algorithm, which checks to see if the current bit decisions correspond to a valid codeword for the code. When a valid codeword is reached, the decoder is stopped. In an embodiment the VCW algorithm may be modified to provide a tunable early stopping algorithm that stops when some fraction of the local code constraints are satisfied. The fraction of the local code constraints that are satisfied provides a fidelity estimate. Other conventional early stopping algorithms can be modified in a similar manner to provide tunable early stopping algorithms.

Figure 1:
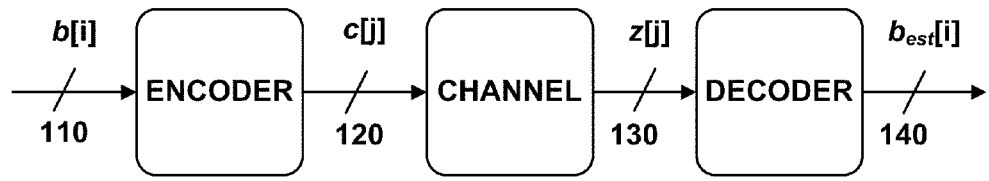
FIG. 1 is a simplified diagram of a basic system model.
Figure 2:
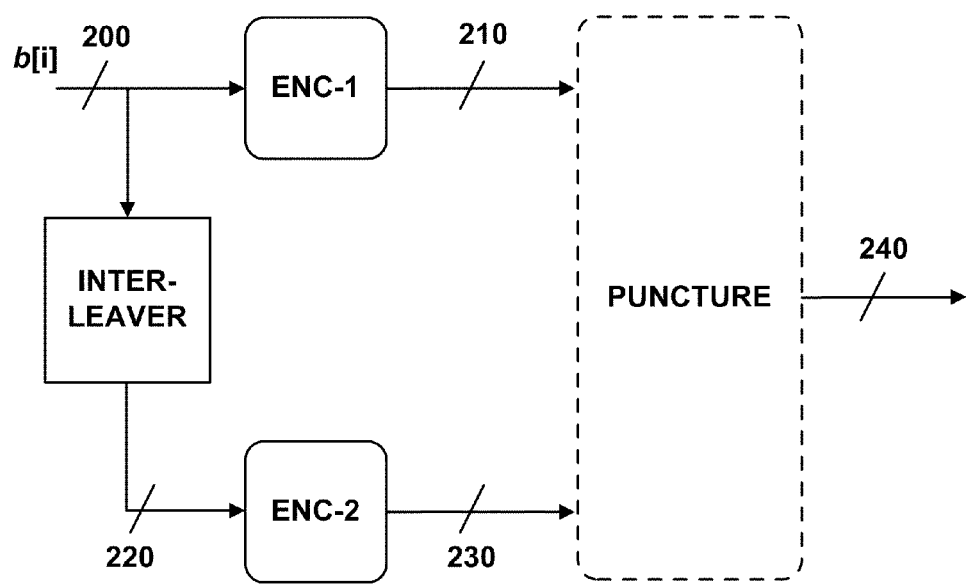
FIG. 2 is a simplified diagram of a turbo coding encoder.
Figure 3:
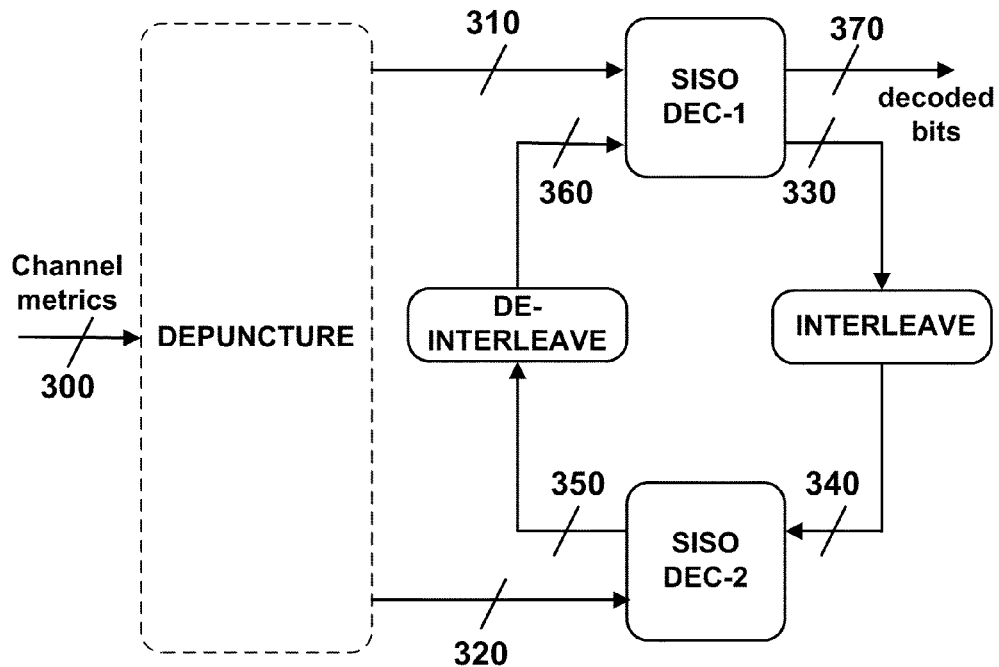
FIG. 3 is a simplified diagram of a turbo coding decoder.
Figure 4:
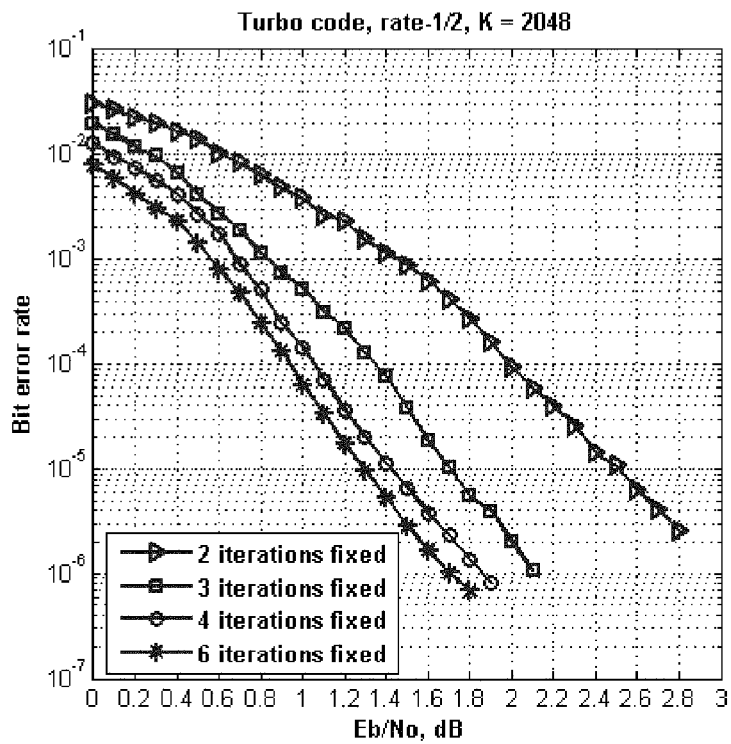
FIG. 4 shows a typical plot of bit error rate as a function of bit energy to noise power ratio (Eb/No) based on number of iterations.
Figure 5:
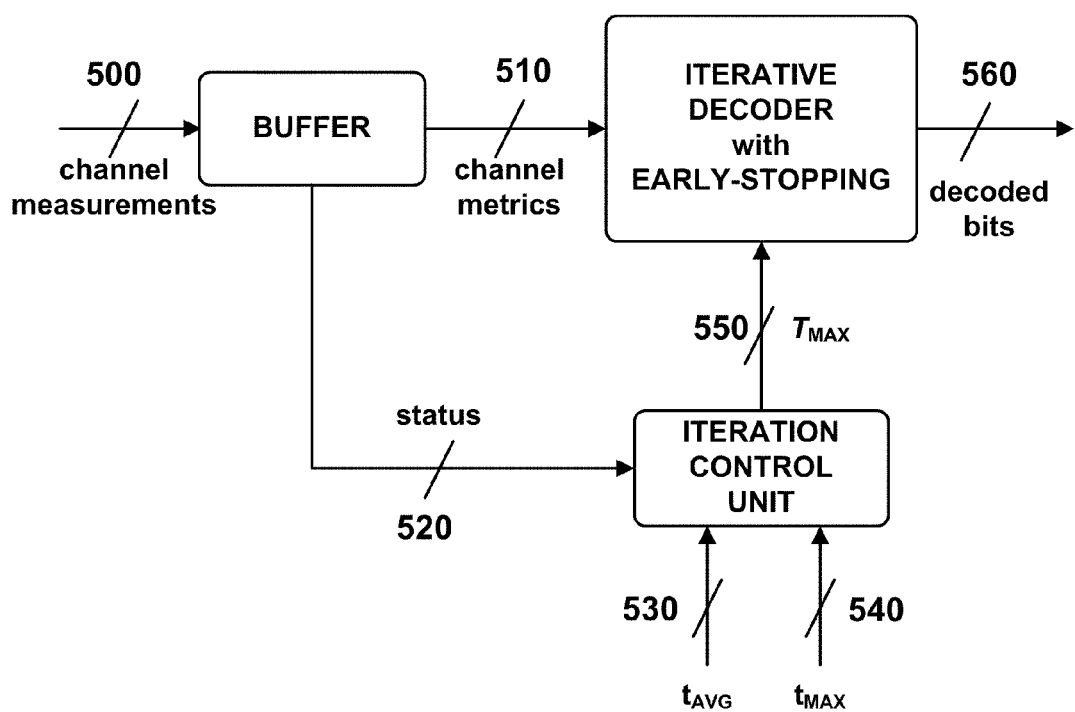
FIG. 5 is a simplified diagram of an early stopping system.
Figure 6:
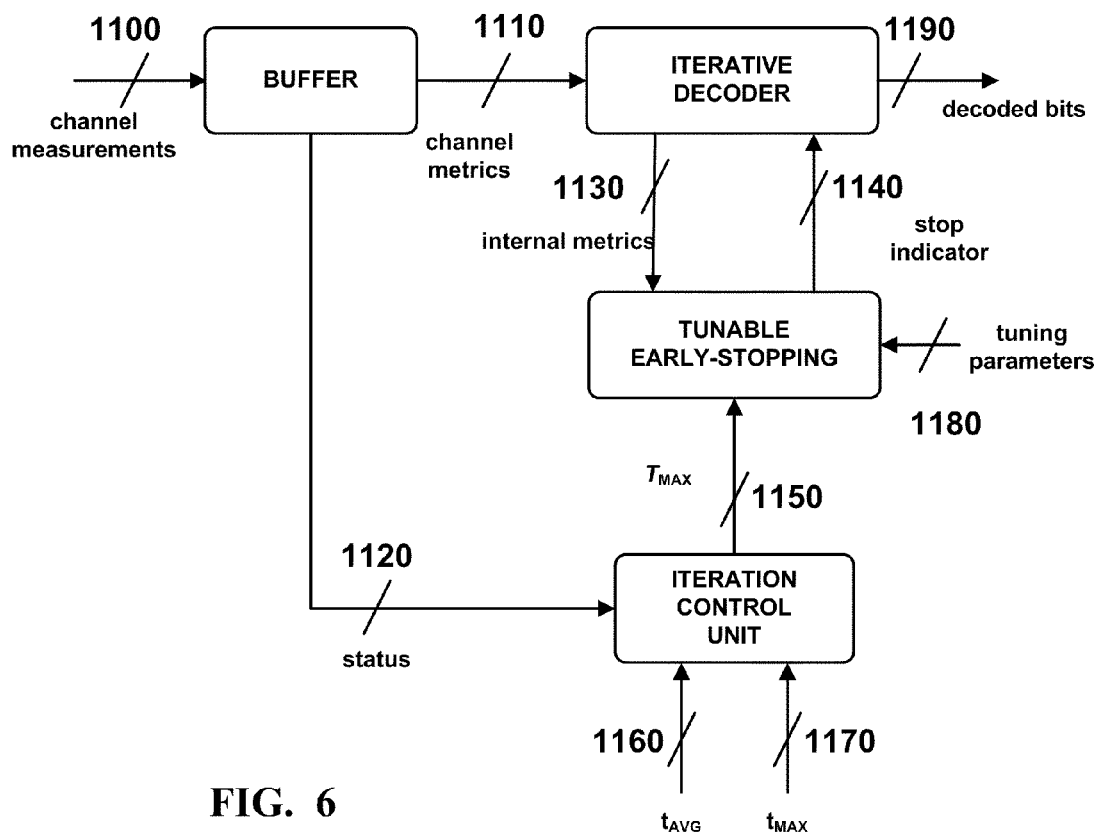
FIG. 6 is a simplified diagram of a tunable early stopping decoder in accordance with an embodiment of the present invention.

Other embodiments of the present invention may include a tunable early stopping algorithm as the basis for a tunable early stopping decoder system. For example, FIG. 6 is a simplified diagram of a tunable early stopping decoder in accordance with an embodiment of the present invention. The system accepts channel measurements (1100) from the channel. These channel measurements are then stored in the buffer. When these measurements are read from the buffer, they are converted to channel metrics (1110) and provided to the decoder. In some embodiments the channel metrics may be computed and stored in the buffer instead. The iterative decoder runs iterations until it is stopped (1140) by the tunable early stopping module. The tunable early stopping module implements a tunable early stopping algorithm with tuning parameters (1180) based on the desired throughput. The tunable early stopping algorithm monitors the status (1130) of the iterative decoder to determine when to stop the decoding. This status is typically derived from the soft-decision metrics being exchanged and/or computed during the iterative decoding. The maximum number of iterations is set by the ICU, which monitors the number of iterations run on previous blocks and the status (1120) of the buffer. In some embodiments the ICU may alter the tuning parameters of the tunable early stopping algorithm. The utility of the system is to provide a specified throughput while maintaining a decoding latency within the limits of the channel measurement buffer.

Figure 7:
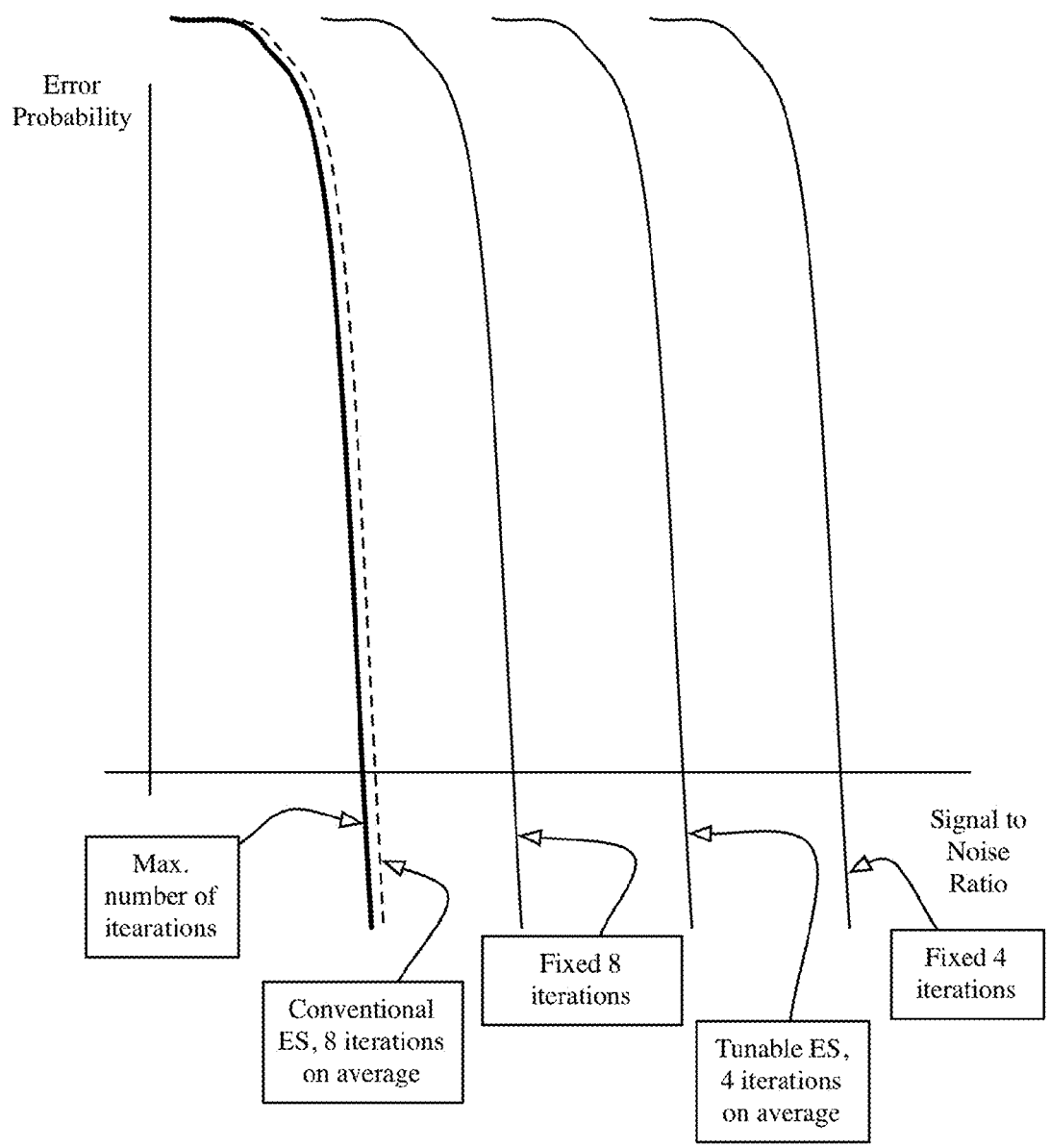
FIG. 7 is an exemplary plot of error probability as a function of signal to noise ratio based on different stopping rules in accordance with an embodiment of the present invention.

A tunable early stopping algorithm may be used, for example, when the average number of iterations associated with a conventional early stopping algorithm is too large to provide the desired throughput. FIG. 7 is an exemplary plot of error probability (e.g., bit error or codeword error) as a function of signal to noise ratio based on different stopping rules in accordance with an embodiment of the present invention.

The curve furthest to the left is achieved using a fixed number of 16 iterations for each block. The next curve to the right is achieved using a conventional early stopping algorithm requiring on average 8 iterations. The conventional early stopping algorithm can provide a throughput twice that of the decoder running 16 iterations with negligible loss in performance. The third curve is achieved using a fixed number of 8 iterations for each block. The decoder using a fixed number of 8 iterations for each block has the same throughput as the conventional early stopping algorithm, but the performance is degraded.

The curve furthest to the right in FIG. 7 is achieved using a fixed number of 4 iterations for each block. This provides a throughput four times faster than that of the decoder using a fixed number of 16 iterations. However, this results in significant performance degradation relative to the 16-iteration decoder. The next curve to the left is achieved using a tunable early stopping algorithm requiring on average 4 iterations. As shown in FIG. 7, a tunable early stopping algorithm requiring on average 4 iterations provides improved performance compared to the decoder using a fixed number of 4 iterations.

Throughput could also be increased in the above example by using a conventional early stopping algorithm with the maximum number of iterations set to 4. If this were done, however, the resulting performance would be worse than the curve furthest to the right that uses a fixed number of 4 iterations.

Embodiments of the present invention may be applied, for example, to iterative decoders of modern (i.e. turbo-like) codes. As an example, one well-studied family of modern turbo-like codes is the class of low-density parity-check (LDPC) codes. LDPC codes are defined by means of a parity-check matrix which has a low density of '1's. The parity-check matrix of a binary (N,K) LDPC code is a binary (N-K) by N matrix. A particular row of the parity-check matrix indicates a linear parity-check constraint that a subset of the codeword bits should satisfy for any codeword. The variables in such a parity-check constraint are the codeword bit positions corresponding to 1's in the associated row.

Figure 8:
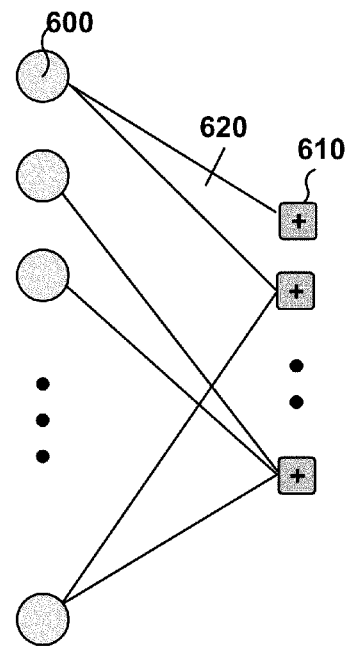
FIG. 8 is a simplified graphical representation of low-density parity check code constraints.

Iterative LDPC decoders associate each coded bit with a variable node and each single parity-check constraint with an SPC node (also often referred to as a check node). FIG. 8 is a simplified graphical representation of LDPC code constraints in which sets of variable nodes (600) are connected to SPC nodes (610) by edges (620). The iterative LDPC decoder operates by updating and exchanging messages between variable nodes and SPC nodes. One iteration of the LDPC decoder is defined as the updating of messages from all variable nodes to connecting SPC nodes (activation of variable nodes) and the updating of messages from all constraint nodes to connecting variable nodes (activation of SPC nodes), regardless of the sequence (i.e. schedule) of the activation.

Figure 9:
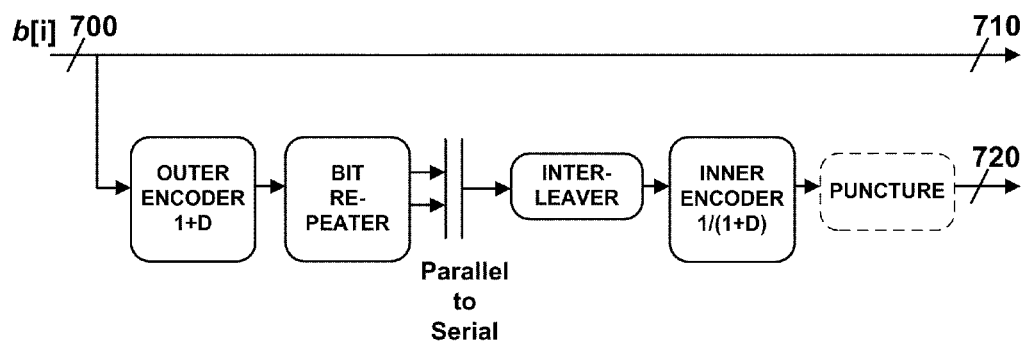
FIG. 9 is a simplified diagram of a flexible low-density parity check encoder.

Another example of a turbo-like code is the Flexible LDPC (F-LDPC) code by TrellisWare Technologies, Inc. of San Diego, Calif. The F-LDPC encoder displayed in FIG. 9 generates parity by serially encoding the data bits (700) with two 2-state convolutional encoders separated by an interleaver and a bit repeater. An F-LDPC codeword consists of systematic bits (710), which include original information bits and parity bits (720).

Figure 10:
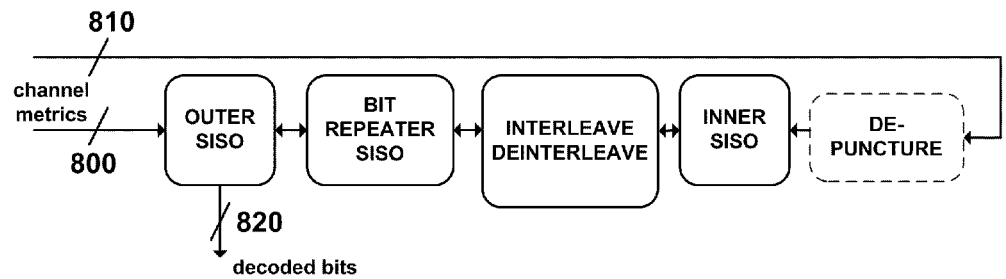
FIG. 10 is a simplified diagram of a flexible low-density parity check iterative decoder.

An iterative decoder for the F-LDPC code works by exchanging messages between SISO modules according to the turbo decoding principles. FIG. 10 is a simplified diagram of an F-LDPC iterative decoder. The decoder routes the set of channel outputs (800) corresponding to systematic bits to a decoder for the outer code and routes the set of channel outputs (810) corresponding to channel inputs from the inner encoder to a decoder for the inner code. One iteration of this decoder consists of the activation of the bit-repeater SISO, interleaving of the soft-decisions, activation of the inner SISO, deinterleaving of the soft decisions, another activation of the bit-repeater SISO, and the activation of the outer SISO, which updates the soft-decisions for data bits.

Iterative decoders for the turbo-like codes, such as the LDPC code and the F-LDPC code, operate by exchanging soft information between several SISO modules. One iteration of the iterative decoder consists of updating soft decision metrics to and from each SISO module.

Tunable Early Stopping Rule Based on BER Estimation

Some embodiments of the present invention use a tunable early stopping algorithm based on an estimate of the probability of bit error for a given decoded block. The probability of bit error provides a fidelity estimate. In addition to the maximum number of iterations, a threshold value for this estimated bit error probability may be utilized as a tuning parameter.

As an example, consider a binary (N, K) FEC code and its iterative decoder whose inputs are soft information derived from channel output $z[j]$. For the BI-AWGN channel, the soft information derived from channel output $z[j]$ is simply a digitized version of $z[j]$. For a general memoryless binary channel specified by the transition probability $p(z[j]|c[j])$, the soft information obtained from $z[j]$ may be a negative log-likelihood ratio (NLLR) given by $\log(p(c[j]=0|z[j])/p(c[j]=1|z[j]))$.

The iterative decoder passes soft decisions back and forth between its constituent SISO decoders in which a round of activation of all SISO decoders is called an iteration. Typically, the decoder is able to compute soft-decisions on the decoded bits after each such iteration. After iteration t, the soft-decision for information bit $b[i]$ is denoted as $u^{(t)}[i]$. In its NLLR form, the soft decision $u^{(t)}[i]$ is given by $$u^{(t)}[i] \approx \log \frac{p(b[i]=0 \mid \{z[j]\}_{j=1}^N)}{p(b[i]=1 \mid \{z[j]\}_{j=1}^N)} \quad (1)$$

where $\approx$ indicates the fact that the computation of the right-hand side of equation (1) may be inexact for a practical decoder. In hardware implementation, soft decisions are integer quantities taking on values from the set $\{-U_{max}, \ldots, -1, 0, 1, \ldots U\}$ where $U_{max}$ is a positive integer. If the decoder chooses to stop after iteration t, the decoding decision for the message bit $b[i]$ is determined by the sign of $u^{(t)}[i]$, therefore $u^{(t)}[i]$ is also called the decision metric for $b[i]$ at the end of iteration t. If $K_e^{(t)}$ denotes the number of decision errors after iteration t, the instantaneous bit error rate (BER) after iteration t can be defined to be the fraction of decision errors to the number of information bits $$BER^{(t)} = \frac{K_e^{(t)}}{K} \quad (2)$$

Figure 11:
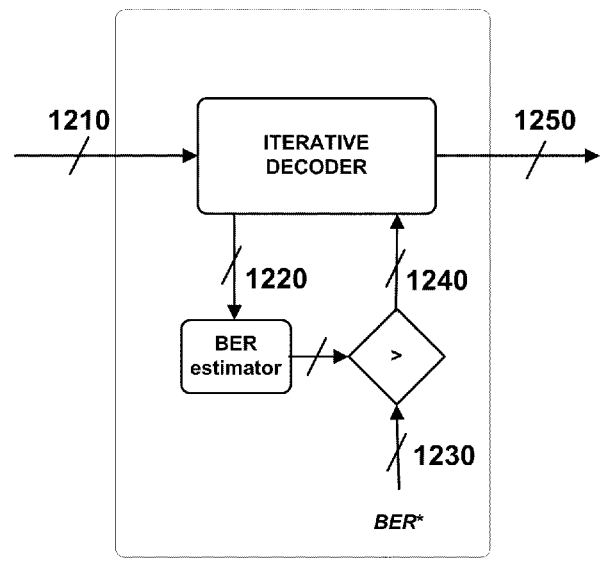
FIG. 11 is a simplified diagram of a tunable early stopping decoder based on bit error rate estimation in accordance with an embodiment of the present invention.

If an estimate of the instantaneous BER is available after each iteration, the decoder can be stopped whenever the estimated BER falls below a determined value. If $BER_{est}^{(t)}$ denotes an estimate of the instantaneous BER after iteration t, the number of iterations the decoder performs for a particular block can be given by $$T = \begin{cases} \min\{t : BER_{est}^{(t)} < BER^*\}, & \text{if } BER_{est}^{(t)} < BER^* \text{ for some } t < T_{MAX} \\ T_{MAX}, & \text{otherwise} \end{cases} \quad (3)$$

where BER* is the tuning parameter and $T_{MAX}$ is the maximum number of iterations that the decoder is allowed to perform on this particular block. The BER threshold BER* allows a trade-off between decoder performance and the average number of iterations. In the absence of an ICU, the quantity $T_{MAX}$ is equal to $t_{MAX}$, which is the maximum allowable decoding latency for any block. If an ICU is utilized, $T_{MAX}$ may change from block to block without exceeding $t_{MAX}$. FIG. 11 is a simplified diagram of a tunable early stopping decoder based on BER estimation in accordance with an embodiment of the present invention. In some embodiments, the parameter BER* may be changed by an ICU.

Figure 12:
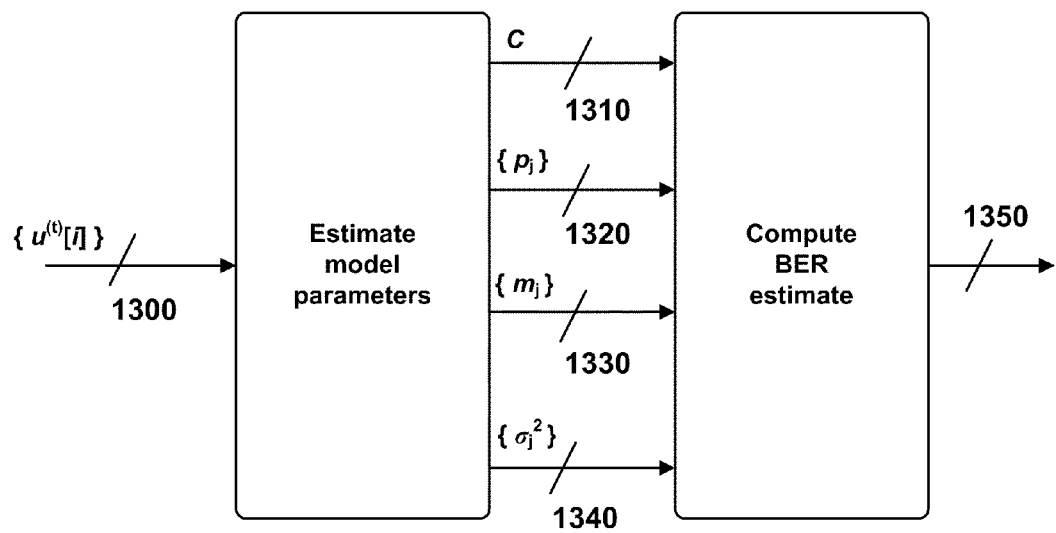
FIG. 12 is a simplified diagram illustrating a method of bit error rate estimation in accordance with an embodiment of the present invention.

BER Estimation Based on Mixture-Gaussian Models for the Decision Metrics on Decoded Bits In some embodiments of the present invention, the decision metrics (in the NLLR form) are modeled as independent samples from a mixture Gaussian distribution consisting of 2C Gaussian distributions (clusters), C with positive means and C with negative means. If $\eta(u; m, \sigma^2) = (2\pi\sigma^2)^{-1/2}\exp(-(u-m)^2/(2\sigma^2))$ denotes the Gaussian probability density function with mean m and variance $\sigma^2 > 0$, the probability density function of a decision metric U can be modeled as $$f_U(u) = \sum_{j=1}^{C} p_j \eta(u; m_j, \sigma_j^2) + \sum_{j=-C}^{-1} p_j \eta(u; m_j, \sigma_j^2) \tag{4}$$

where $m_{-C} < \ldots < m_{-2} < m_{-1} < 0 < m_1 < m_2 < \ldots < m_C$, and $\{p_j\}$ are the mixture probabilities adding to 1. If the parameters (e.g., number of clusters, cluster means, cluster variances, and mixture probabilities) of equation (4) are available, an estimate of the instantaneous BER can be computed as a weighted sum of Gaussian tail probabilities $$BER_{est} = \sum_{j=1}^{C} p_j Q\left(\frac{m_j}{\sigma_j}\right) + \sum_{j=-C}^{-1} p_j Q\left(\frac{-m_j}{\sigma_j}\right) \tag{5}$$

where $Q(x) = (2\pi)^{-\frac{1}{2}} \int_{t=x}^{\infty} e^{-x^2/2} dt$ is the standard Gaussian tail integral function. FIG. 12 is a simplified diagram illustrating a method of bit error rate estimation in accordance with an embodiment of the present invention.

The number of mixture clusters, 2C, are a function of the structure of the code and the particular implementation of decoder and may be determined off-line by computer simulation. Turbo codes and regular LDPC codes typically exhibit two clusters, whereas irregular LDPC codes may exhibit four or more. Typically, if the distribution of the soft decisions input to the decoder is symmetric around the origin, so is the distribution of the decision metrics at the output of the decoder, in which case equation (4) may be simplified by assuming $m_{-j} = m_j$, $\sigma^2_{-j} = \sigma^2_j$, and for $j=1, \ldots, C$.

Figure 13:
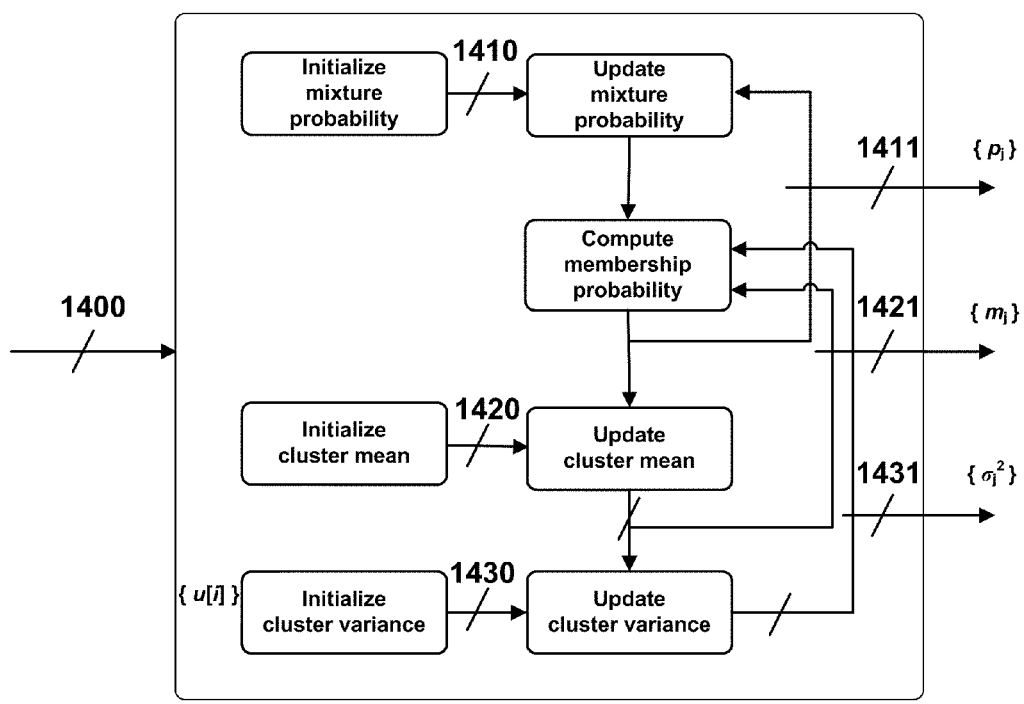
FIG. 13 is a simplified diagram illustrating a method of mixture model parameter estimation in accordance with an embodiment of the present invention.

Once the number of clusters is established, the estimation of cluster parameters can be performed using the expectation-maximization (EM) algorithm in accordance with known techniques. The EM algorithm is initialized with rough estimates of cluster means, cluster variances, and mixture probabilities. The algorithm computes the probability $q_j[i]$ that u[i] belongs to cluster-j in the model, for each u[i] and for each cluster j, based on the existing estimates of the cluster means, variances, and mixture probabilities. These probabilities are called membership probabilities. The membership probabilities are used to update the cluster means and mixture probabilities. The updated cluster means and membership probabilities are used to update cluster variances. The updated mixture probabilities, cluster means, and cluster variances can be used to compute a BER estimate using equation (5), or the EM algorithm may continue to update the model parameters until model parameters stabilize. FIG. 13 is a simplified diagram illustrating a method of mixture model parameter estimation in accordance with an embodiment of the present invention.

For a symmetric 2-cluster mixture model ($m_{-1} = -m_1$, $\sigma^2_{-1} = \sigma^2_1$), equations (6a, 6b, 6c) provide an exemplary initialization stage.

$$p_1 \leftarrow \frac{|\{i: u[i] > 0\}|}{K}, \quad p_{-1} \leftarrow 1 - p_1 \tag{6a}$$

$$m_1 \leftarrow \frac{1}{K} \sum_{i=1}^{K} |u[i]| \quad (m_{-1} = -m_1) \tag{6b}$$

$$\sigma_1^2 \leftarrow \frac{1}{K} \sum_{i=1}^{K} |u[i]|^2 - |m_1|^2 \quad (\sigma^2_{-1} = \sigma_1^2) \tag{6c}$$

For the same model, equations (7a) to (7d) provide the updates.

$$q_1[i] \leftarrow \frac{1}{1 + \frac{p_{-1}}{p_1} \exp\left(-\frac{2m_1 u[i]}{\sigma_1^2}\right)}, \quad q_{-1}[i] \leftarrow 1 - q_1[i], \tag{7a}$$

$$i = 1, \ldots, K$$

$$p_1 \leftarrow \frac{1}{K} \sum_{i=1}^{K} q_1[i], \quad p_{-1} = 1 - p_1 \tag{7b}$$

$$m_1 \leftarrow \sum_{i=1}^{K} (2q_1[i] - 1) u[i], \quad m_{-1} = -m_1 \tag{7c}$$

$$\sigma_1^2 \leftarrow \frac{1}{K} \sum_{i=1}^{K} |u[i]|^2 - |m_1|^2, \quad \sigma^2_{-1} = \sigma_1^2 \tag{7d}$$

Techniques for Iteration Control

In tunable early stopping systems, such as the tunable early stopping system illustrated in FIG. 6, the incoming blocks of channel measurements are typically written to a buffer that can hold M blocks of measurements. If n denotes the time index of the block of channel measurements available to the receiver, then for the decoding of data block n, the ICU computes a maximum number, $T_{MAX}[n]$, of allowable iterations not exceeding the maximum number of iterations, $t_{MAX}$, that the decoder can perform on any block. The number of iterations that the decoder actually performs on data block n is denoted by T[n]. These quantities are related through $$T[n] \leq T_{MAX}[n] \leq t_{MAX} \tag{8}$$

Figure 14:
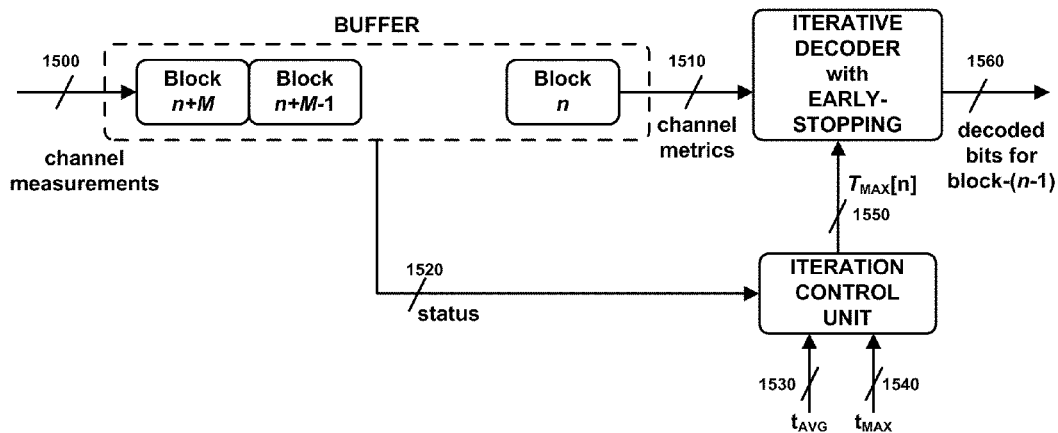
FIG. 14 is a simplified diagram of an iteration control unit in accordance with an embodiment of the present invention.

FIG. 14 is a simplified diagram of an ICU in accordance with an embodiment of the present invention. The ICU illustrated in FIG. 14 keeps track of the number of iterations run for each of the last L decoded blocks and computes the maximum allowable number of iterations for the next block based on these L quantities. For example, the maximum allowable number of iterations may be set such that even if the decoder performs the maximum allowable number of iterations for the next block, the average number of iterations for the last (L+1) blocks is still below $t_{AVG}$. Mathematically, the ICU sets $$T_{MAX}[n] = \max\left\{t_{MAX}, \left\lfloor (L+1)t_{AVG} - \sum_{l=1}^{L} T_{MAX}[n-l] \right\rfloor\right\}, \quad n > L \tag{9}$$

where [x] represents the largest integer not exceeding x. For the first L blocks (n=1, . . . , L), $T_{MAX}[n] = t_{AVG}$ may be selected. Using equation (8) the average number of iterations on any set of consecutive blocks is guaranteed to not exceed $t_{AVG}$.

Figure 15:
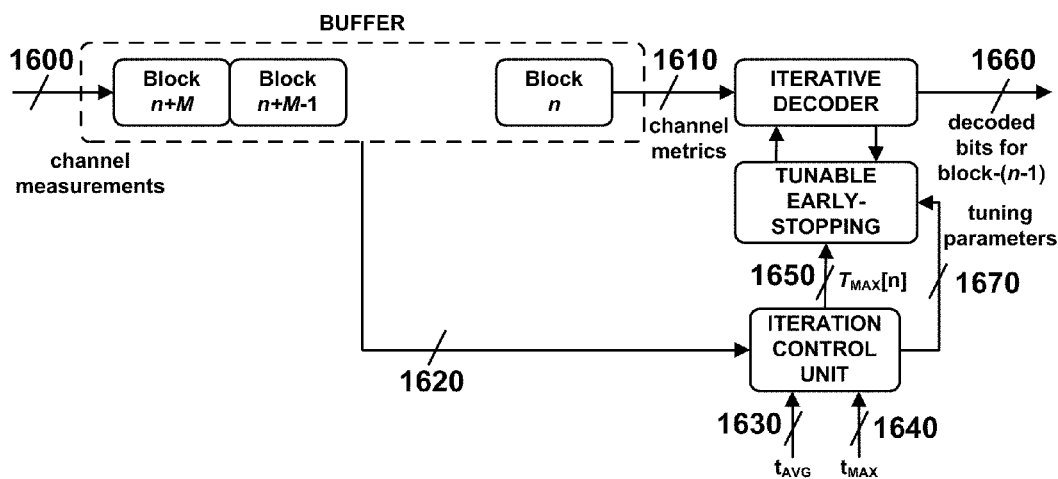
FIG. 15 is a simplified diagram of an iteration control unit in accordance with another embodiment of the present invention.

FIG. 15 is a simplified diagram of an ICU in accordance with another embodiment of the present invention. As shown in FIG. 15, the ICU may modify the parameters (1670) of the tunable early-stopping module. To improve efficiency, tuning parameters can be re-adjusted when the channel statistics of the channel metrics change. Accordingly, in an embodiment the ICU monitors the history of the number of iterations performed and adjusts the tuning parameters. Tuning parameters are typically correlated with the number of iterations that the decoder performs.

Simulation Results

Figure 16:
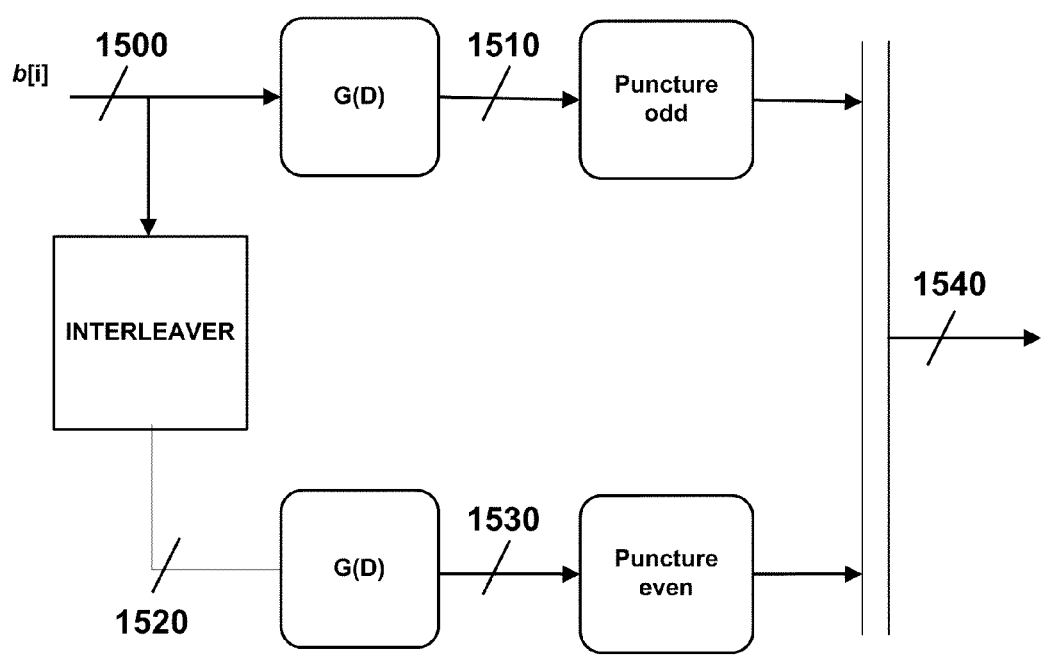
FIG. 16 is a simplified diagram of a rate-1/2 turbo coding encoder in accordance with an embodiment of the present invention.

FIG. 16 is a simplified diagram of a rate-1/2 turbo coding encoder in accordance with an embodiment of the present invention. In this example, the upper and lower constituent encoders are recursive systematic convolutional codes with transfer function $G(D)=(1+D^2)/(1+D+D^2)$. At the output of the upper encoder (1510), bits with odd indices are punctured, and at the output (1530) of the lower encoder, bits with odd indices are punctured to produce the parity bits. For an input block size of K information bits, the turbo encoder produces K parity bits. The interleaver size is also K.

Figure 17:
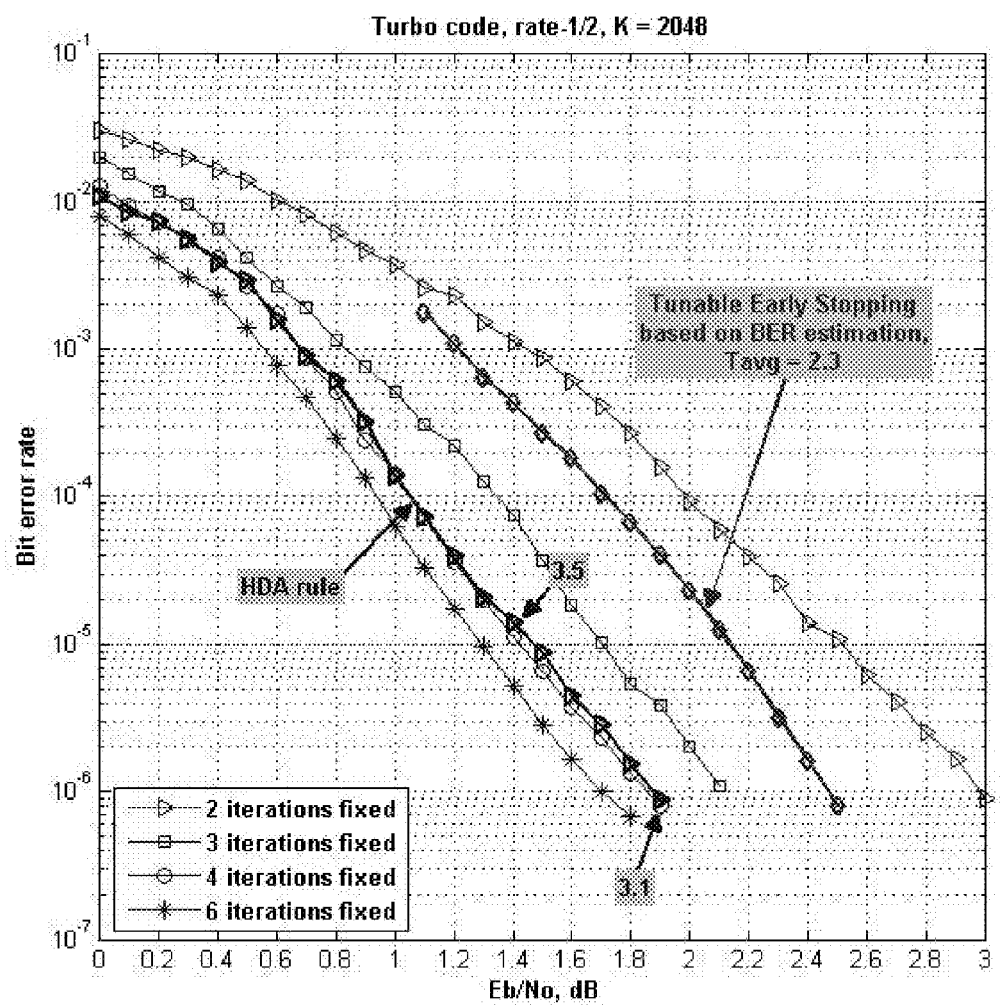
FIG. 17 shows a plot of bit error rate as a function of bit energy to noise power ratio (Eb/No) based on number of iterations in accordance with an embodiment of the present invention.

FIG. 17 shows a plot of bit error rate as a function of bit energy to noise power ratio (Eb/No) for T=2, 3, 4, and 6 iterations in accordance with an embodiment of the present invention. There is very little gain in performance beyond 6 iterations. With 3 iterations, the fixed iteration rule requires approximately 0.4 dB higher Eb/No to achieve the same BER as 6 iterations. With 2 iterations, the performance loss is approximately 1.2 dB. The conventional HDA stopping rule requires an average of 3.1 iterations and approximately 0.2 dB higher Eb/No to achieve the same BER as the fixed iteration rule running 6 iterations. The tunable early stopping rule can reduce the average number of iterations to 2.3 while requiring approximately 0.8 higher Eb/No to achieve the same BER as the fixed iteration rule running 6 iterations.

Figure 18:
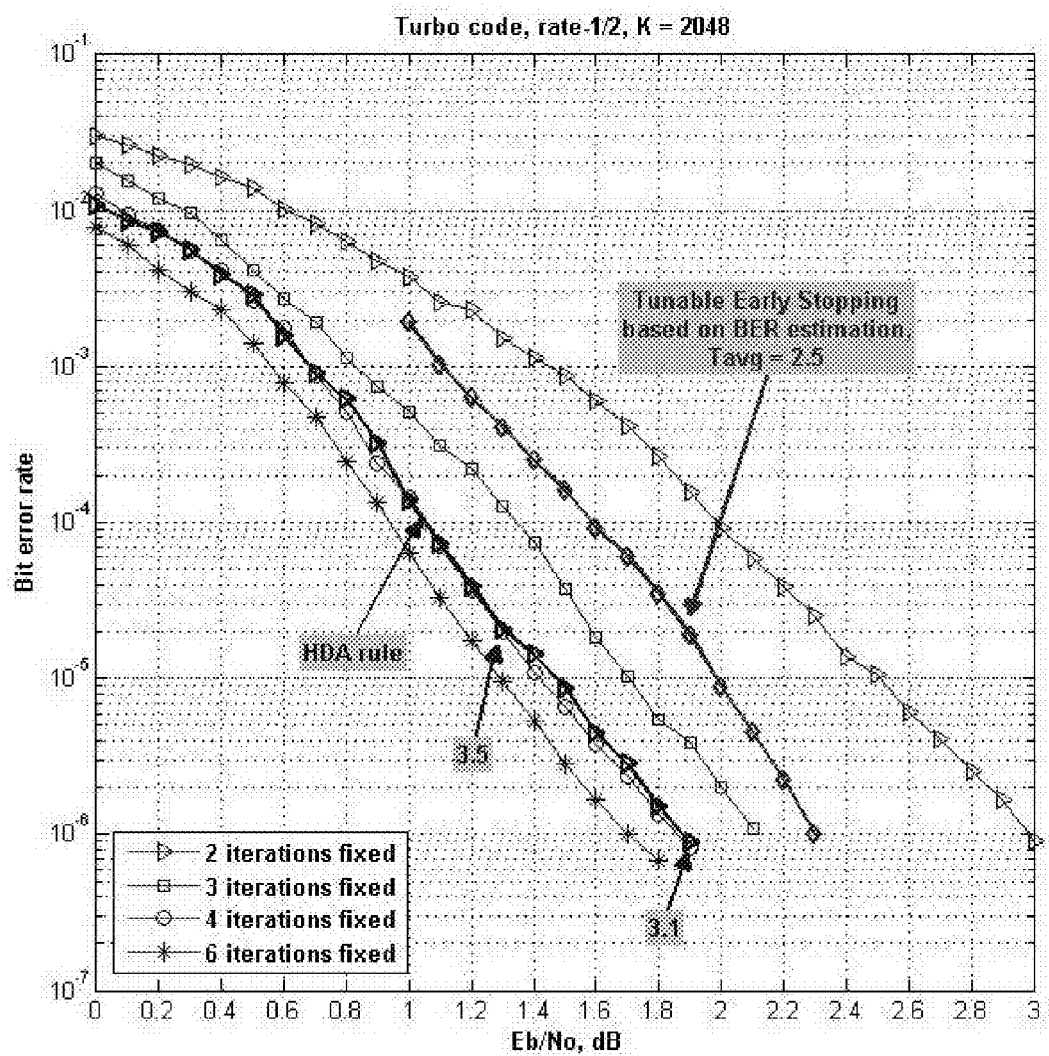
FIG. 18 shows a plot of bit error rate as a function of bit energy to noise power ratio (Eb/No) based on different stopping rules in accordance with an embodiment of the present invention.

FIG. 18 shows a plot of bit error rate as a function of Eb/No based on different stopping rules in accordance with an embodiment of the present invention. FIG. 18 compares the performance of an HDA stopping-rule, a tunable early-stopping rule based on BER estimation, and a fixed iteration rule on a BI-AWGN channel. The HDA stopping rule achieves a BER of 1e-6 at an Eb/No of 1.9 dB with a $t_{AVG}$ of about 3.1 iterations. The tunable early-stopping rule based on BER estimation, configured to deliver a $t_{AVG}$ of 2.5 iterations with a maximum allowed 16 iterations for each block, achieves a BER of 1e-6 at an Eb/No that is 0.7 dB lower than the fixed iteration rule running two iterations.

Figure 19:
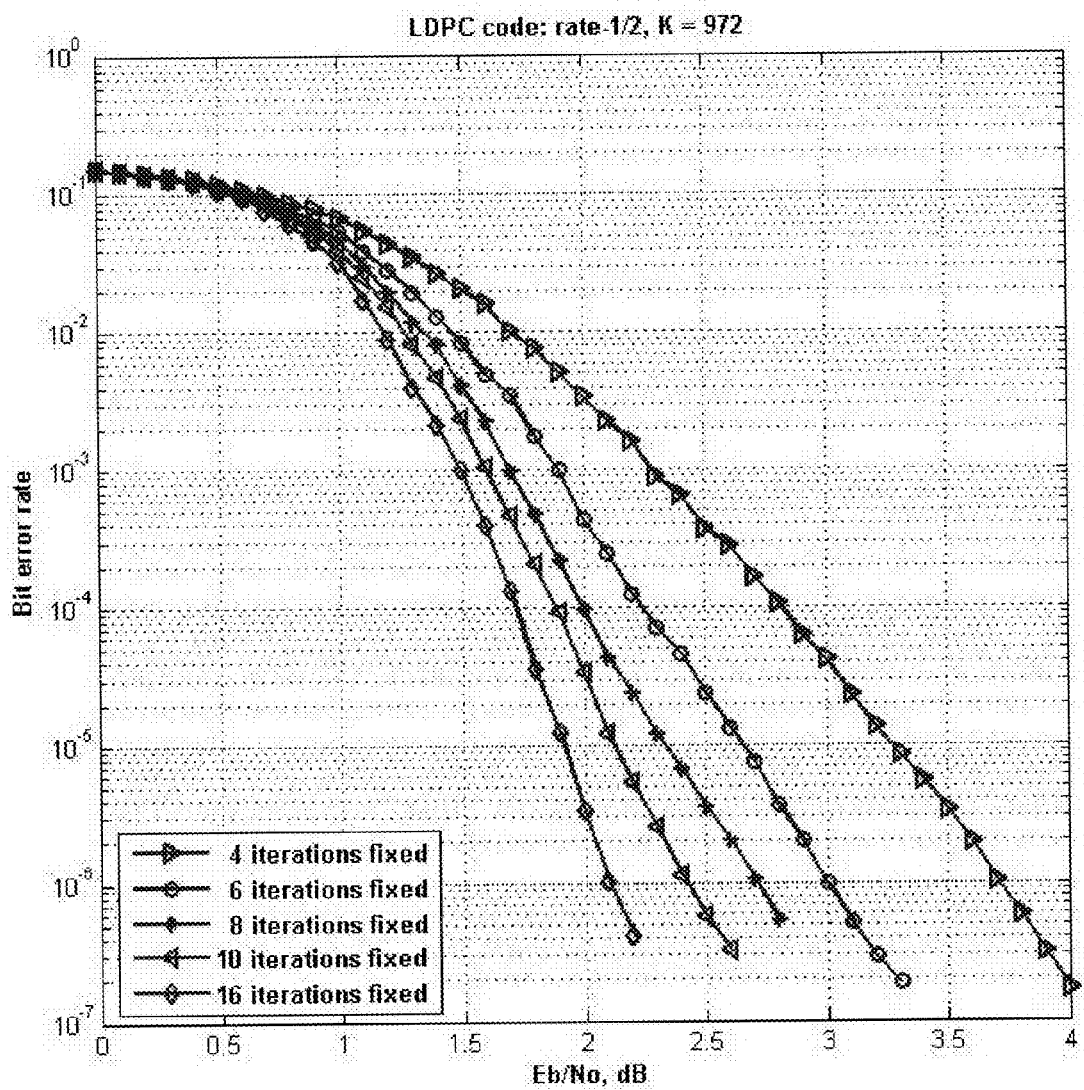
FIG. 19 shows a plot of bit error rate as a function of bit energy to noise power ratio (Eb/No) based on number of iterations using a fixed iteration decoder.

FIG. 19 shows a plot of bit error rate as a function of Eb/No based on number of iterations using a fixed iteration decoder. The code used in the example of FIG. 19 is the (1944, 972) rate-1/2 low-density parity-check code specified in the IEEE 802.11n high-throughput wireless LAN standard. There is very little performance gain beyond 16 iterations. With fewer iterations, however, there is considerable performance penalty. For example, as shown in FIG. 19, with 6 iterations the decoder would require about 1 dB higher Eb/No to achieve a BER of 1e-6. This illustrates the trade-off between performance and latency using a fixed iterations rule.

Figure 20:
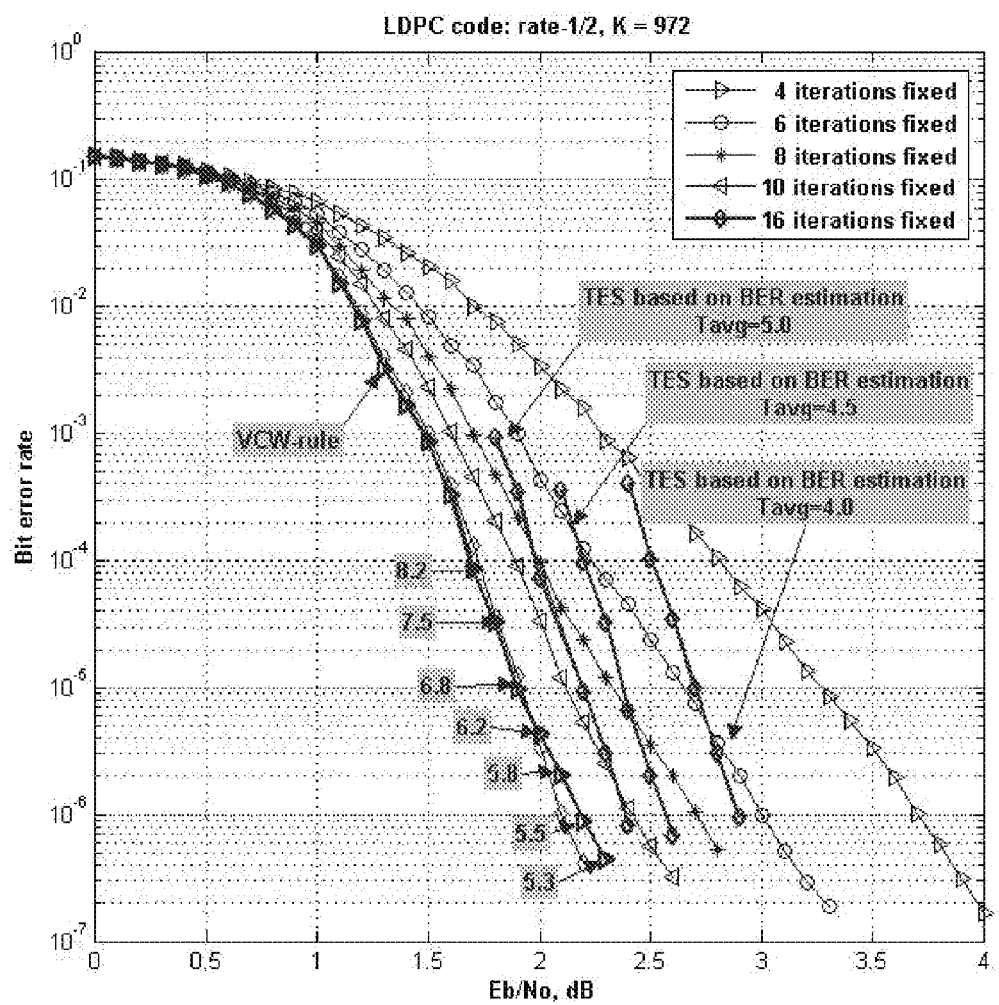
FIG. 20 shows a plot of bit error rate as a function of bit energy to noise power ratio (Eb/No) based on different stopping rules in accordance with an embodiment of the present invention.

FIG. 20 shows a plot of bit error rate as a function of Eb/No based on different stopping rules in accordance with an embodiment of the present invention. FIG. 20 compares the performance of a conventional valid code word (VCW) stopping-rule, a tunable early-stopping rule based on BER estimation, and a fixed iteration rule using the rate-1/2 LDPC code on the BI-AWGN channel. The VCW stopping rule achieves a BER of 1e-6 at a Eb/No of approximately 2.2 dB with a $t_{AVG}$ of about 5.5 iterations. The BER performance of the tunable early-stopping rule based on BER estimation is shown for three different configurations ($t_{AVG}$=4.0, 4.5, 5.0). The tunable early-stopping rule can reduce the average number of iterations compared to the VCW stopping rule while reducing Eb/No compared to the fixed iteration rule.

Figure 21:
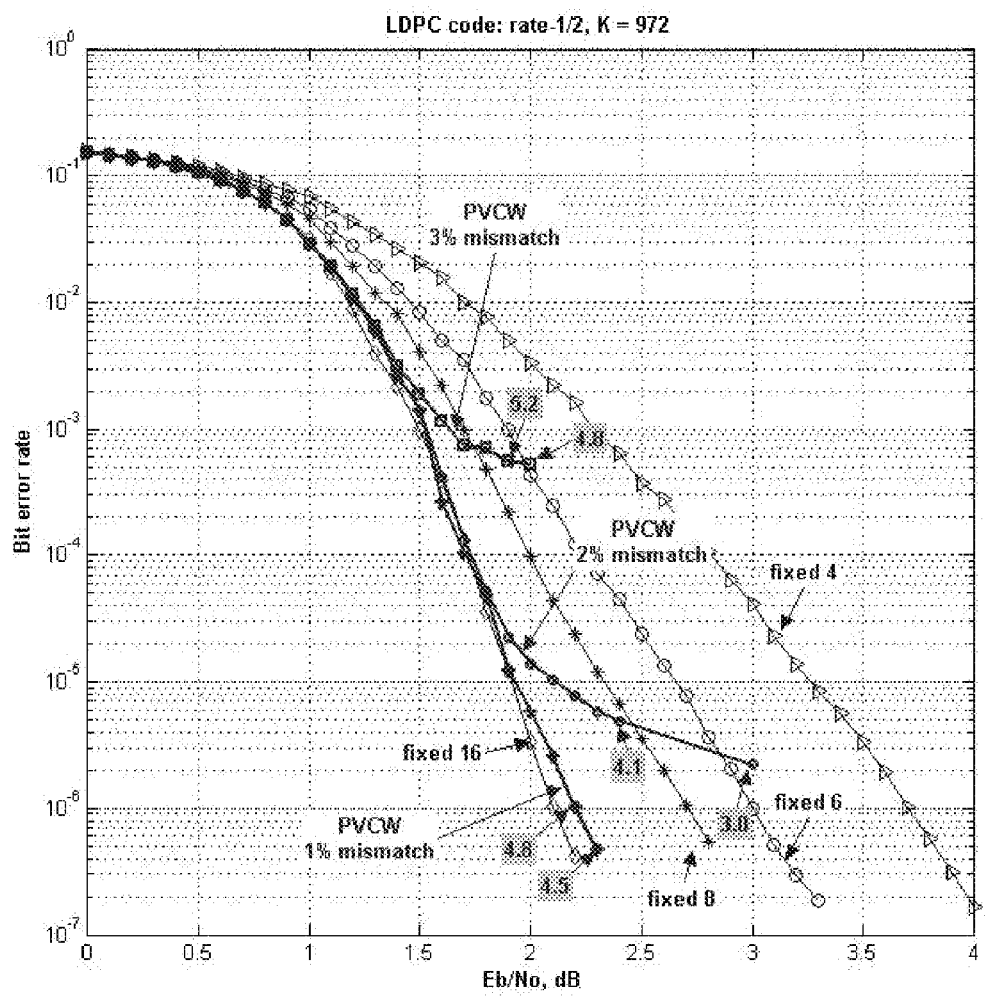
FIG. 21 shows a plot of bit error rate as a function of bit energy to noise power ratio (Eb/No) based on different stopping rules in accordance with another embodiment of the present invention.

FIG. 21 shows a plot of bit error rate as a function of Eb/No based on different stopping rules in accordance with another embodiment of the present invention. FIG. 21 shows the BER performance of the rate-1/2 LDPC code using the a VCW stopping rule and a partially-valid codeword (PVCW) stopping rule. The p-percent PVCW algorithm is a tunable early stopping rule that stops the decoder as soon as the mismatch between the codeword obtained by re-encoding the bit decisions and the full codeword decision is below p-percent. The VCW algorithm delivers near-convergence performance at 5.5 iterations on average to achieve a BER of 1e-6. At a BER of 1e-6, the 1-percent PVCW algorithm trades 0.1 dB of performance for a savings of 0.7 iterations on average. Without an ICU, the PVCW algorithm exhibits a BER floor of around 1e-3 with 3-percent mismatch.

Figure 22:
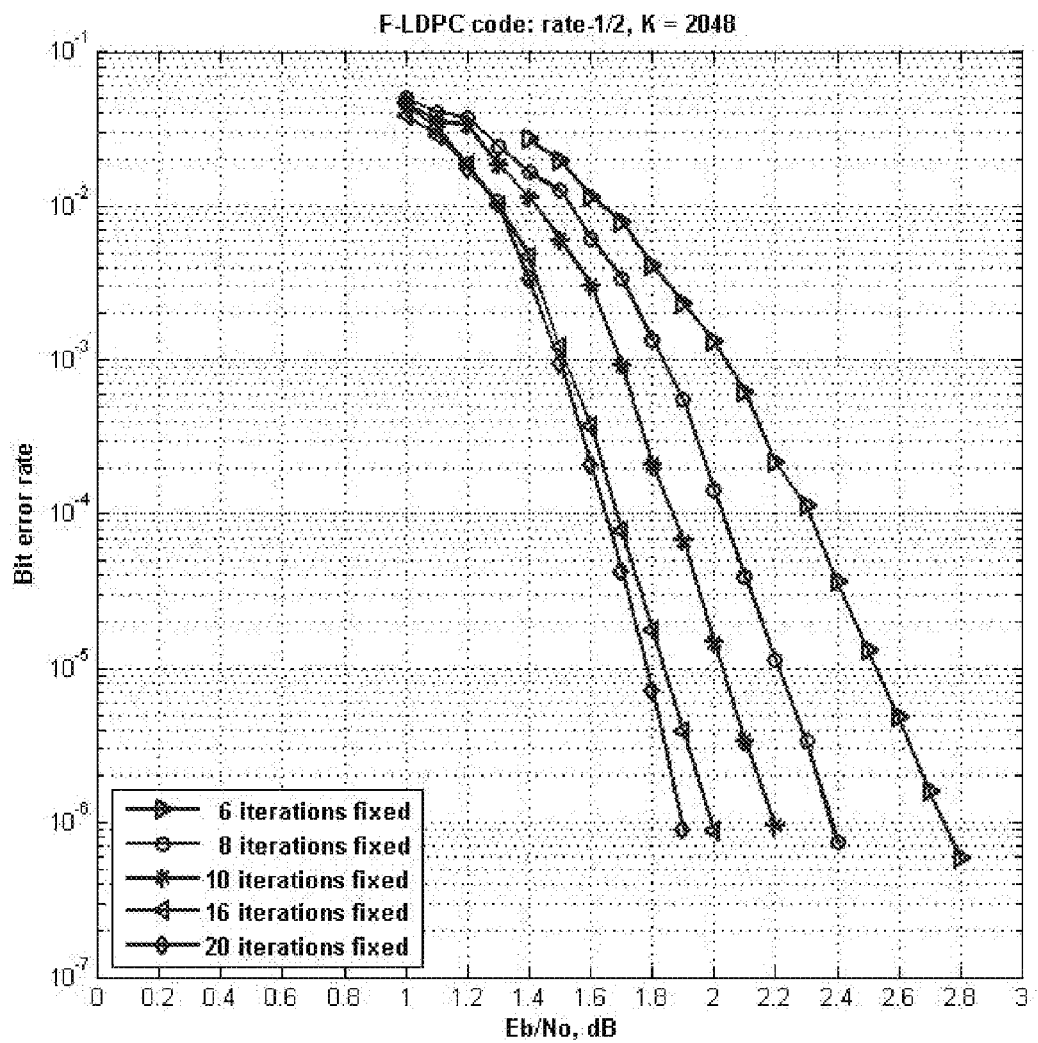
FIG. 22 shows a plot of bit error rate as a function of bit energy to noise power ratio (Eb/No) based on number of iterations using a fixed iteration decoder.

The tunable early stopping system has also been tested using the F-LDPC code by TrellisWare Technologies, Inc. of San Diego, Calif. FIG. 22 shows a plot of bit error rate as a function of Eb/No based on number of iterations using a fixed iteration decoder. FIG. 22 shows the BER performance of the rate-1/2 F-LDPC with K=2048 bits and a fixed iteration decoder on a BI-AWGN channel. There is very little improvement in BER beyond 20 iterations. With 16 iterations, the BER performance is 0.1 dB worse than with 20 iterations. With 10 iterations, the BER performance degrades by another 0.2 dB. At 8 iterations, the BER performance is 0.5 dB worse than the BER performance with 20 iterations.

Figure 23:
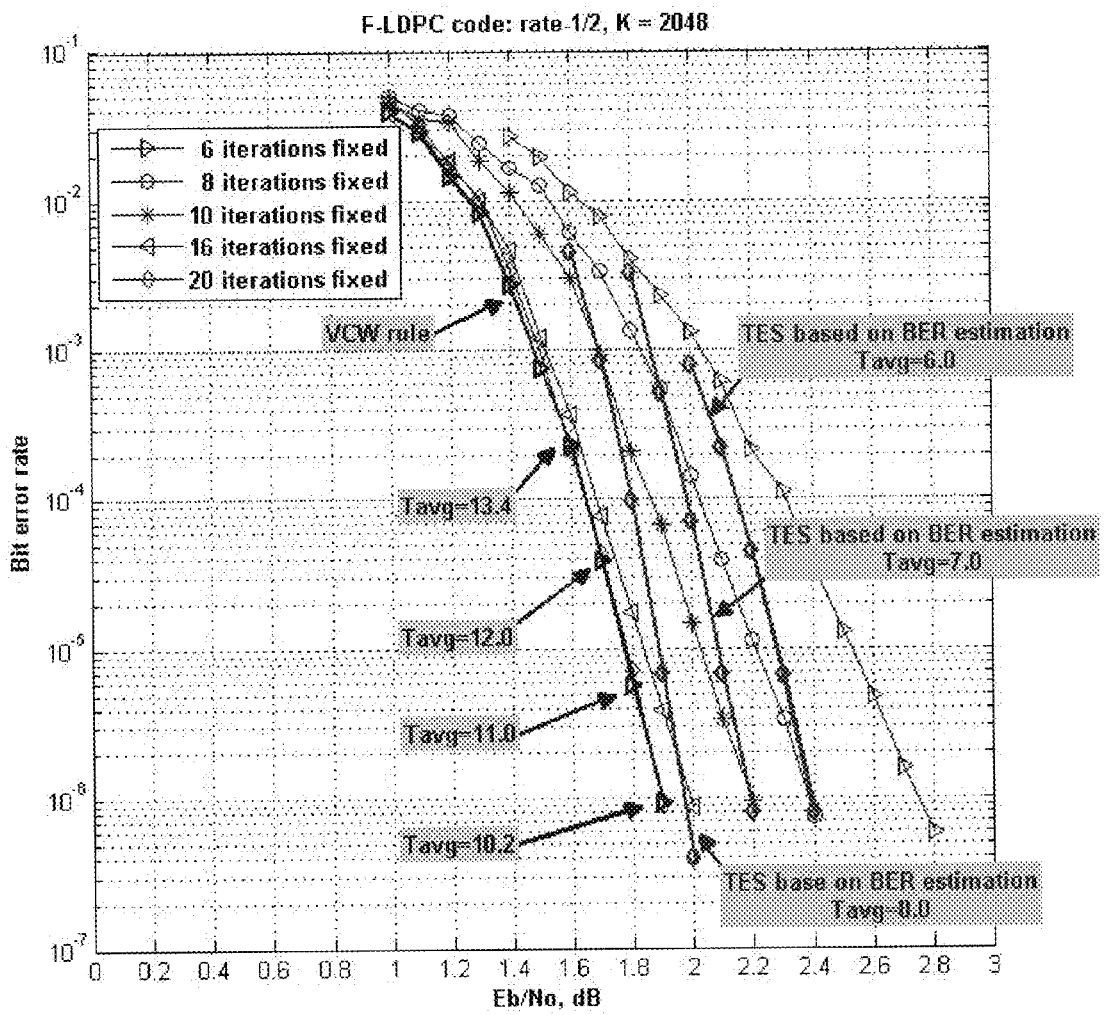
FIG. 23 shows a plot of bit error rate as a function of bit energy to noise power ratio (Eb/No) based on different stopping rules in accordance with another embodiment of the present invention.

FIG. 23 shows a plot of bit error rate as a function of Eb/No based on different stopping rules in accordance with another embodiment of the present invention. FIG. 23 compares the performance of a conventional VCW stopping-rule, a tunable early-stopping rule based on BER estimation, and a fixed iteration rule using the F-LDPC code on a BI-AWGN channel. The VCW stopping rule achieves a BER of 1e-6 at an Eb/No of 1.9 dB and requires about 10.2 iterations on average. The BER performance of the tunable early-stopping rule based on BER estimation is shown for three different configurations. There is an approximately 0.1 dB difference between the performance of the VCW stopping rule with an average of 10.2 iterations and the tunable early stopping rule based on BER estimation with an average of 8.0 iterations.

While the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the disclosure may be encoded on various computer readable media for storage and/or transmission. Suitable media include magnetic disk or tape, optical storage media such as compact disk (CD) or digital versatile disk (DVD), flash memory, and the like. Such programs may also be encoded and transmitted using carrier signals adapted for transmission via wired, optical, and/or wireless networks conforming to a variety of protocols, including the Internet. Computer readable media encoded with the program code may be packaged with a compatible device or provided separately from other devices (e.g., via Internet download).

Thus, although the invention has been described with respect to specific embodiments, it will be appreciated that the invention is intended to cover all modifications, combinations, and equivalents within the scope of the following claims.

What is claimed is:

1. A method of decoding channel outputs using an iterative decoder to provide hard decisions on information bits, the method comprising the steps of:
   receiving a target average number of iterations for the iterative decoder to provide the hard decisions on the information bits;
   activating each soft-in/soft-out (SISO) decoder of the iterative decoder to provide soft-decisions associated with the information bits;
   computing a fidelity estimate based on the soft-decisions;
   obtaining one or more tuning parameters, the tuning parameters based on the target average number of iterations;
   and
   stopping decoding before convergence of the soft-decisions based on the fidelity estimate and the tuning parameters.

2. The method of claim 1 wherein computing the fidelity estimate includes computing an estimated bit error rate.

3. The method of claim 1 wherein the fidelity estimate is an instantaneous bit error rate.

4. The method of claim 1 further comprising repeating activating each SISO decoder of the iterative decoder to provide second soft-decisions, wherein computing the fidelity estimate includes determining bit decisions associated with the soft-decisions and with the second soft-decisions that are the same.

5. The method of claim 1 wherein computing the fidelity estimate includes computing a fraction of local code constraints satisfying a specified criteria.

6. The method of claim 1 wherein the soft-decisions include bit decisions and measures of confidence.

7. The method of claim 1 wherein activating each SISO decoder of the iterative decoder comprises:
   receiving soft-in information at a SISO first decoder;
   determining soft-out information at the SISO first decoder;
   receiving the soft-out information at a SISO second decoder; and
   determining second soft-out information at the SISO second decoder.

8. The method of claim 1 further comprising:
   repeating activating each SISO decoder of the iterative decoder and computing the fidelity estimate.

9. The method of claim 1 wherein computing the fidelity estimate comprises computing a weighted sum of Gaussian tail probabilities.

10. The method of claim 1 further comprising determining a maximum number of iterations for decoding the channel outputs.

11. The method of claim 1 further comprising determining channel metrics based on the channel outputs, and modifying the tuning parameters based on the channel metrics.

12. The method of claim 1 further comprising modifying the tuning parameters based on a number of iterations of the iterative decoder.

13. The method of claim 1 wherein the iterative decoder consists of one SISO decoder.

14. A method of decoding a channel output using an iterative decoder, the method comprising the steps of:
   receiving a target average number of iterations for the iterative decoder to decode the channel output;
   activating a decoder of the iterative decoder to provide a first soft-decision on the channel output during a first iteration of the iterative decoder;
   computing a first estimated instantaneous bit error rate based on the first soft-decision;
   obtaining one or more tuning parameters, the tuning parameters based on the target average number of iterations;
   repeating activating the decoder and computing an estimated instantaneous bit error rate to provide a plurality of soft-decisions and to compute a plurality of estimated instantaneous bit error rates during a plurality of iterations of the iterative decoder; and
   stopping decoding before convergence of the plurality of soft-decisions based on an estimated instantaneous bit error rate of the plurality of estimated instantaneous bit error rates and the tuning parameters.

15. The method of claim 14 further comprising determining a maximum number for the plurality of iterations.

16. The method of claim 15 wherein the maximum number is determined for each block of information bits.

17. A tunable early stopping decoder comprising:
   a buffer configured to store channel outputs; and
   an iterative decoder coupled to the buffer and configured to determine soft-decisions associated with information bits using the channel outputs, the tunable early stopping decoder configured to:
   receive a target average number of iterations for the iterative decoder to decode the channel outputs;
   compute a fidelity estimate based on the soft-decisions,
   obtain one or more tuning parameters that are based on the target average number of iterations,
   and
   determine when to stop iterative decoding of the soft-decisions based on the fidelity estimate and the tuning parameters.

18. The tunable early stopping decoder of claim 17 further comprising:
   an iteration control unit configured to determine a maximum number of iterations for decoding the channel outputs.

19. The tunable early stopping decoder of claim 17 wherein the tunable early stopping decoder is further configured to modify the tuning parameters based on a number of iterations of the iterative decoder.

20. The tunable early stopping decoder of claim 17 wherein the tunable early stopping decoder is further configured to modify the tuning parameters based on channel metrics of the channel outputs.

21. The tunable early stopping decoder of claim 17 wherein the tunable early stopping decoder is further configured to stop the iterative decoder if the fidelity estimate is less than a threshold value.

* * * * *